United States Patent [19]

Yakuwa et al.

[11] Patent Number: 4,953,056
[45] Date of Patent: Aug. 28, 1990

[54] CURRENT DETECTION APPARATUS FOR USE IN ELECTROMAGNETIC ACTUATOR DRIVE CIRCUIT

[75] Inventors: Masahiko Yakuwa; Hideto Iijima, both of Tochigi, Japan

[73] Assignee: Honda Giken Kogyo Kabushiki Kaisha, Tokyo, Japan

[21] Appl. No.: 144,429

[22] Filed: Jan. 15, 1988

[51] Int. Cl.5 .................................. H01H 9/00
[52] U.S. Cl. ........................... 361/154; 123/490
[58] Field of Search .............. 361/152, 153, 154; 387/350, 352, 353; 323/272, 285; 341/122; 123/490; 364/483

[56] References Cited

U.S. PATENT DOCUMENTS

| | | | |
|---|---|---|---|
| 4,378,766 | 4/1983 | Yamazoe et al. | 251/129.05 |
| 4,433,369 | 2/1984 | Noro | 363/84 |
| 4,446,410 | 5/1984 | Yagura et al. | 318/687 |
| 4,458,487 | 7/1984 | Kojima et al. | 60/494 |
| 4,743,821 | 5/1988 | Hall | 318/599 |
| 4,770,178 | 9/1988 | Sausner et al. | 361/154 X |
| 4,825,333 | 4/1989 | Clive et al. | 361/154 |

*Primary Examiner*—L. T. Hix
*Assistant Examiner*—David M. Gray
*Attorney, Agent, or Firm*—Lyon & Lyon

[57] ABSTRACT

In a current detector for use with a pulse-driven electromagnetic actuator drive circuit, a solenoid current detector is disclosed which operates by use of a solenoid current detection resistor to sample an instantaneous solenoid current value at intervals of a predetermined pulse voltage period, and calculates the average current value for the solenoid by calculation based on the sampled value.

21 Claims, 3 Drawing Sheets

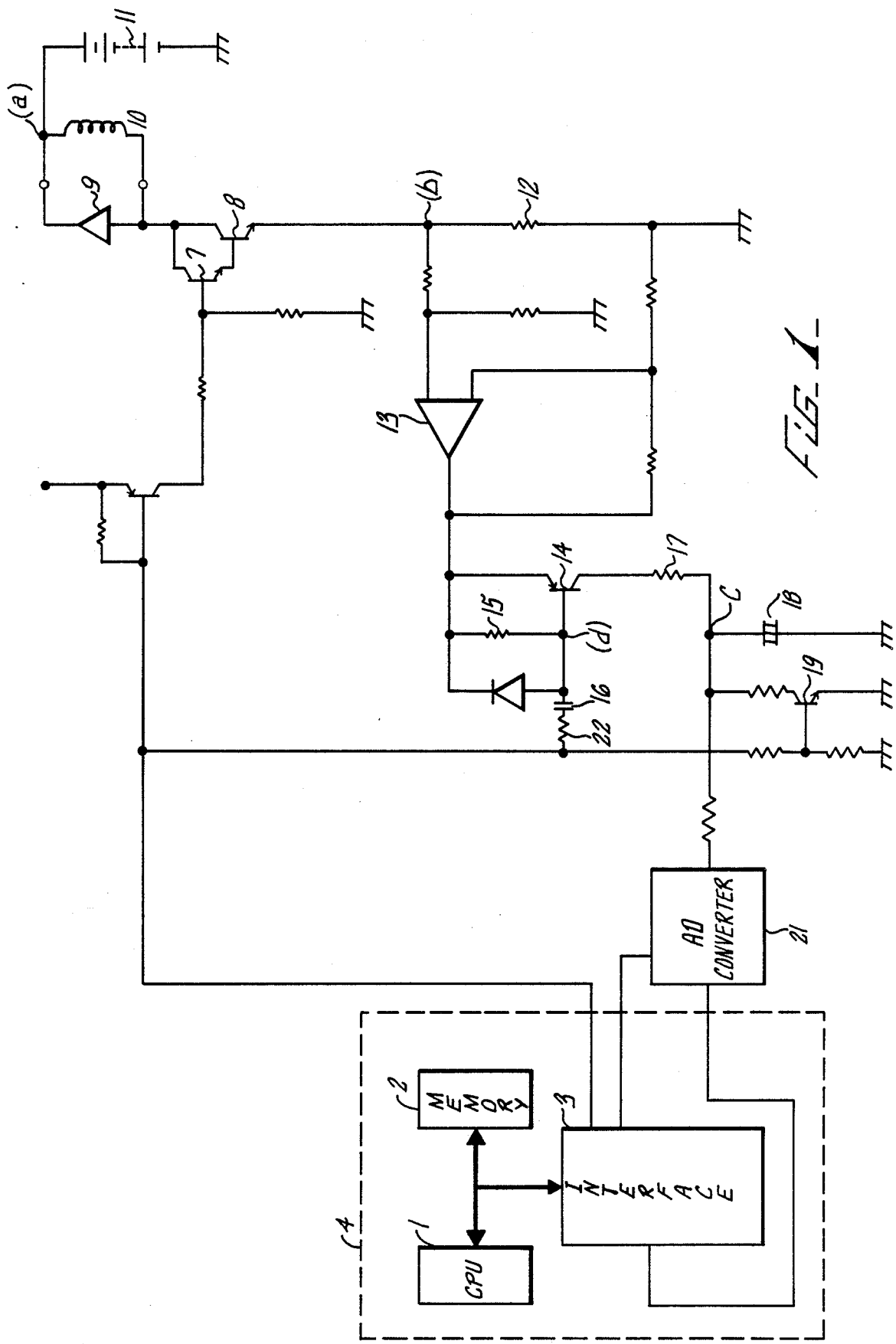

CURRENT DETECTION APPARATUS FOR USE IN ELECTROMAGNETIC ACTUATOR DRIVE CIRCUIT

BACKGROUND OF THE INVENTION

1. Field of the Invention

This invention relates to the field of current detectors for use in electromagnetic actuator drive circuits. More specifically, this invention relates to those current detectors for detecting a solenoid current in those electromagnetic actuator drive circuits which control the opening of an electromagnetic valve based on such a solenoid current.

2. Description of Related Art

There are several known methods for controlling electromagnetic actuator drive circuits which control the opening of an electromagnetic valve based on a solenoid current, and these methods may be broadly divided into two classes. A first class is those methods which control the solenoid by supplying a solenoid transistor driver circuit with a DC voltage. A second class is those methods which control the solenoid by supplying a solenoid transistor driver circuit with a pulse voltage signal.

It is also known to detect the current in the solenoid by means of a solenoid current detection resistor, connected in series with the solenoid and the solenoid transistor driver circuit, which detects the solenoid current based on the voltage appearing across the resistor. The detected solenoid current may then be used for executing feedback control, as is well known in the art, so as to adjust the solenoid current value to correspond with an external adjusting control.

In the first class of methods noted above for controlling electromagnetic actuator drive circuits, one problem which has arisen in the art is that the solenoid transistor driver circuit is constantly driven in its active region, as shown for example in U.S. Pat. No. 4,378,766, published Apr. 5, 1983, hereby incorporated by reference. This causes larger than desired power consumption and larger than desired production of waste heat. Consequently, the second class of methods noted above has become preferred in the art. One such method is shown in Japanese Laid-open Patent Publication No. 57-137901, published Aug. 25, 1982, and in U.S. Pat. No. 4,458,487, published July 10, 1987, both hereby incorporated by reference.

In the second class of methods noted above for controlling electromagnetic actuator drive circuits, one problem which has arisen in the art is that the voltage detected across the solenoid current detection resistor will vary with the pulse voltage signal. To determine an accurate solenoid current value, the this varying voltage must be smoothed with a filter. This causes a time delay between the input of a correcting control signal to the solenoid actuator, and the solenoid current which is measured in response.

SUMMARY OF THE INVENTION

Accordingly, it is an object of the invention to provide a circuit and method which avoids the problems noted in prior designs. The invention may comprise a solenoid current detector circuit which determines the average current value of a solenoid current in a pulse-driven electromagnetic actuator drive circuit, which detector circuit operates by use of a solenoid current detection resistor to sample an instantaneous solenoid current value at intervals of a predetermined pulse voltage period, and calculates the average current value for the entire period of solenoid operation by calculation based on the sampled value.

BRIEF DESCRIPTION OF THE DRAWINGS

FIG. 1 is a circuit diagram of an embodiment of the present invention.

DESCRIPTION OF THE PREFERRED EMBODIMENT

Figure 4:
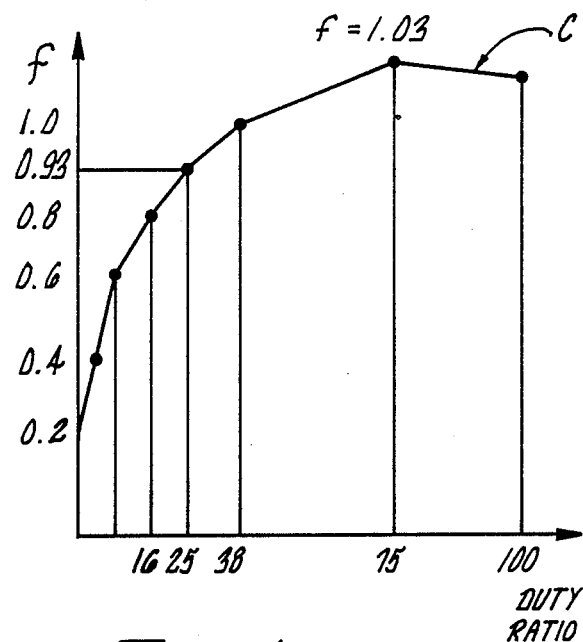
FIG. 4 is a graph which relates the relation between a correction factor (f) and the duty ratio of the solenoid.

FIG. 1 is a circuit diagram of an embodiment of the present invention. In a preferred embodiment of the invention, the solenoid is part of an electromagnetic actuator used in a bypath of a throttle valve, for blocking an upstream portion and a downstream portion of such valve in an internal combustion engine in a motor vehicle.

A microprocessor (CPU) 1, a memory 2, and an interface 3 collectively comprise a microcomputer 4. A pair of transistors 7 and 8 are solenoid driving transistors arranged in a solenoid driving configuration for driving a solenoid 10. A battery 11 supplies power to the solenoid 10. A solenoid current detection resistor 12 measures the current in solenoid 10 by the voltage across resistor 12, an amplifier 13 amplifies the voltage across resistor 12. An A/D converter 21 converts a voltage at node E (disclosed herein) to a digital signal for the microcomputer 4.

FIGS. 2a–2e are timing diagrams of several waveforms exhibited in the embodiment of FIG. 1. Nodes A–E are labelled in FIG. 1 as the nodes at which waveforms 2a–2e respectively are detected.

Figure 2:
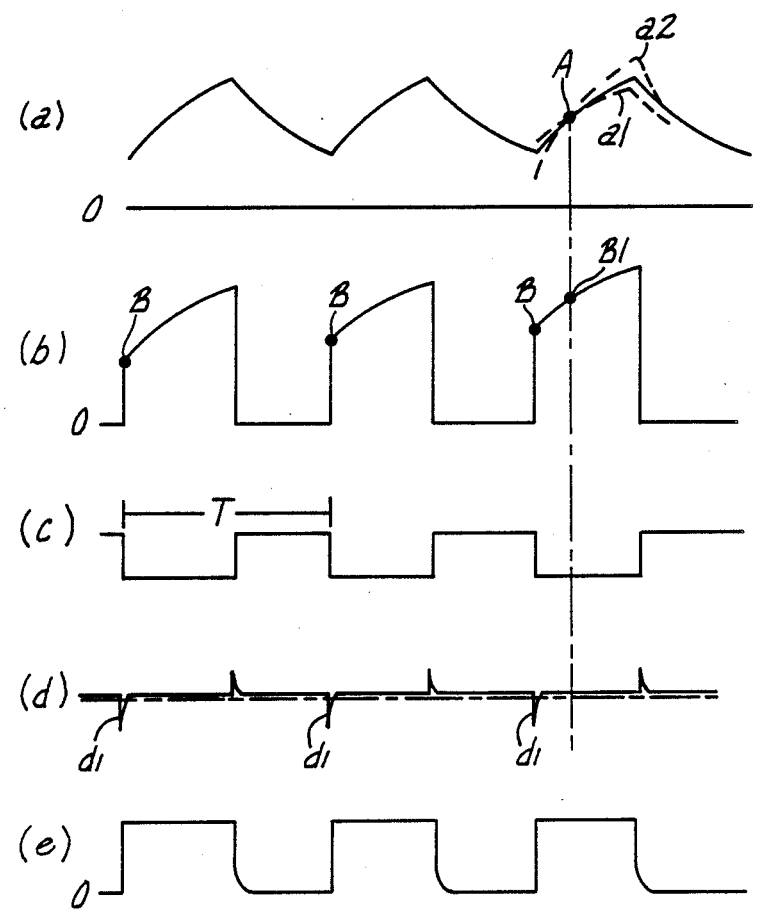
FIGS. 2a–2e are timing diagrams of several waveforms exhibited in the embodiment of FIG. 1.

The microcomputer 4 outputs a pulse voltage signal with a constant time period T and with a duty ratio which may vary in accordance with engine operating conditions. FIG. 2c shows the voltage signal which is output, at node C. This voltage signal is applied to the base of a transistor 6, causing the transistor 6 to be on/off controlled by whether the voltage signal at node C is high or low. Accordingly, the solenoid driving transistors 7 and 8 are also on/off controlled, in synchrony with the transistor 6. This causes a solenoid current, corresponding to the on/off state of the transistors 7 and 8 to flow through the solenoid 10, producing a solenoid current as shown in FIG. 2a.

During the "on" period of the transistors 7 and 8, current flows from the battery 11, through the solenoid 10, the transistor 8 and the solenoid current detection resistor 12, to ground. Therefore, a voltage will appear across the solenoid current detection resistor 12, i.e. at node B, which corresponds to the solenoid current at node A. This voltage is shown in FIG. 2b. The voltage appearing across resistor 12, i.e. at node B, is amplified by amplifier 13.

In a preferred embodiment, a differentiation circuit is formed by the amplifier 13, a resistor 15, a capacitor 16, a resistor 22 and the microcomputer 4, as shown in FIG. 1. The differentiation circuit generates a differential signal when the pulse voltage at node C varies from high to low and vice versa; these differential signals appear at node D and are shown in FIG. 2d.

A transistor 14 is turned on for a short period of time, while the differential signal d1 (shown in FIG. 2d) is falling (in response to the falling edge of the pulse voltage signal at node C) until the cutoff level of the transistor 14 is reached. A dotted line in FIG. 2d shows the cutoff level of the transistor 14. It will be clear to those of ordinary skill in the art that the duration of this short period is determined by the time constant of the differentiation circuit.

While the transistor 14 is turned on, a capacitor 18 is charged by the output of amplifier 13 (the amplified voltage across the resistor 12, at node B) which appears when the transistor 8 is turned on. The voltage across the capacitor 18 is supplied to the A/D converter 21. The A/D converter 21 is activated at predetermined times to convert this voltage to a digital signal, and this digital signal is read by the microcomputer 4. The microcomputer 4 then calculates the solenoid current value (the "average current value", Iave), as disclosed herein.

Further, when the pulse voltage signal at node C is high, a transistor 19 is turned on so that the capacitor 18 is discharged. As will be clear to those of ordinary skill in the art, the voltage across the capacitor 18 is reset at intervals of period T by the pulse voltage signal at node C. FIG. 2e shows the waveform of the voltage across the capacitor 18.

Figure 3:
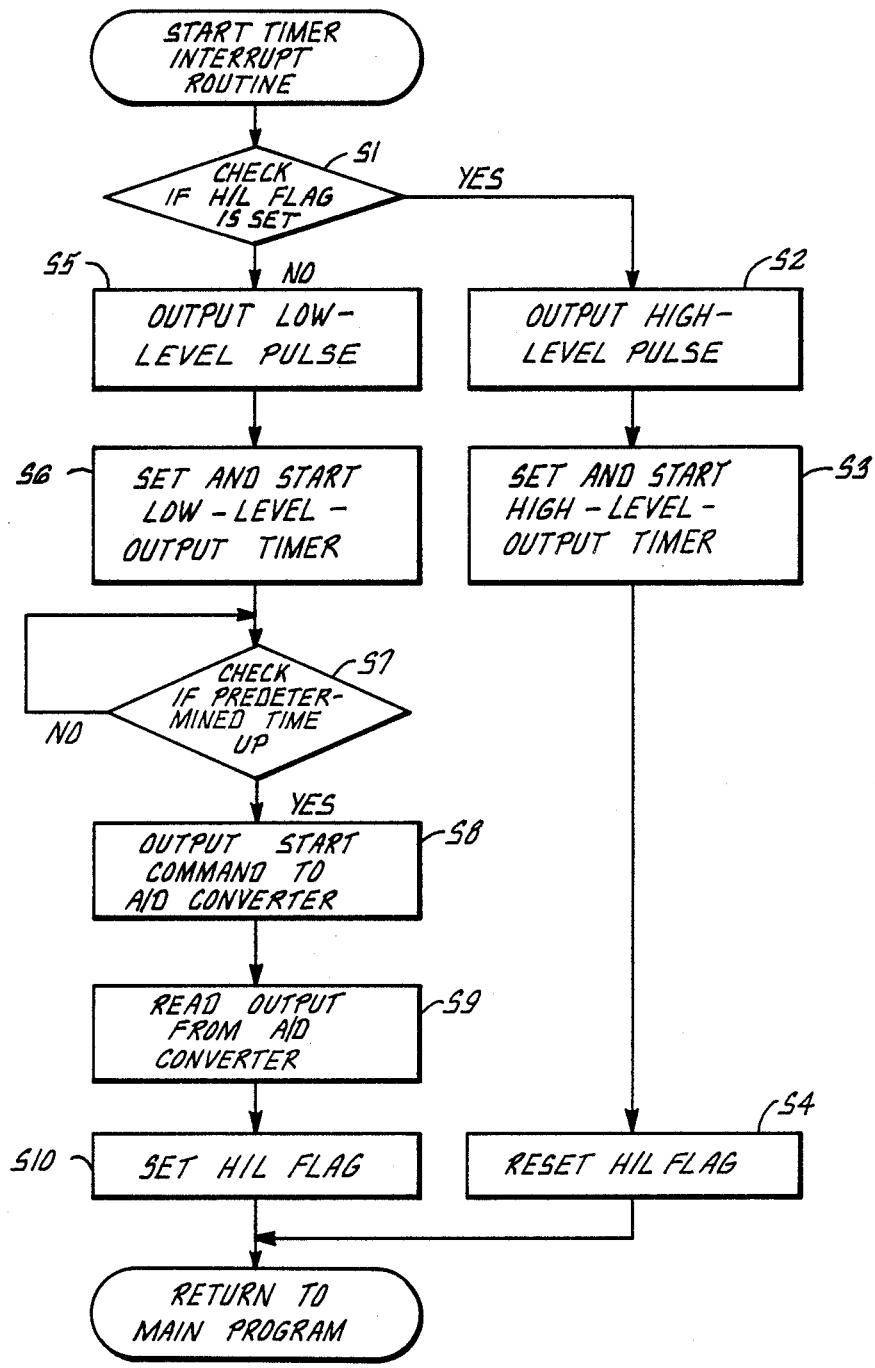
FIG. 3 is a flowchart of the operations performed by a microcomputer for use with the present invention.

FIG. 3 is a flowchart of the operations performed by a microcomputer for use with the present invention. As will be clear to one of ordinary skill in the art, the microcomputer 4 executes its operations under control of a program interrupt routine which is activated by a timer interrupt.

At step s1, the routine checks a high/low flag. If the high/low flag is set, control continues with step s2; otherwise control continues with step s5.

At step s2, the pulse voltage signal is set to be a high-level voltage, and control continues with step s3.

At step s3, a high-level-output timer for setting the output period for the high-level voltage is set and started, and control continues with step s4.

At step s4, the high/low flag is reset and the interrupt routine is terminated (i.e. control returns to the main program.)

In the main program, the high-level-output timer disclosed with respect to step s3, as well as the low-level-output timer disclosed with respect to step s6, are watched for timeouts. When either timeout occurs, the program interrupt routine of FIG. 3 is started. Thus when a timeout occurs for the high-level-output timer, step s1 is re-executed and control continues with step s5.

At step s5, the pulse voltage signal is set to be a low-level voltage, and control continues with step s6.

At step s6, the low-level-output timer for setting the output period for the low-level voltage is set and started, and control continues with step s7.

It will be clear to one of ordinary skill in the art that the period set in the low-level-output or high-level-output timers may be determined according to the operating conditions of the engine. The sum of the time set for low-level output and the time set for high-level output is constant, and corresponds to one period T of the pulse voltage signal at node C.

At step s7, the routine checks to see if a predetermined period of time has elapsed. The predetermined period of time may be arbitrary, but must exceed the time from when the low-level voltage is output at step s5 to when the negative differential signal d1 reaches the cutoff level of the transistor 14, and must be less than the amount of time until the high-level voltage will be output at the next iteration of step s2. Thus, when the predetermined period of time has elapsed, the capacitor 18 retains the voltage from the amplifier 13 which it had when the transistor 14 reached its cutoff level.

At step s8, the A/D converter 21 is instructed to begin its operation. The A/D converter 21 will convert the retained voltage on the capacitor 18 to a digital signal and output the same for use by the microcomputer 4. Control continues with step s9.

At step s9, the microcomputer 4 reads the output digital value from the A/D converter 21, and control continues with step s10.

At step s10, the high/low flag is set and the interrupt routine is terminated (i.e. control returns to the main program).

The method used by the microcomputer 4 to calculate the average current value (Iave) of the solenoid current, for one period of the pulse voltage signal, is disclosed as follows:

As is well known in the art, the value of the solenoid current at any instant in a period of the pulse voltage signal (the "instantaneous current value", Ir) can be determined from the average current value Iave and a correction factor f, using the equation $$Iave = Ir \cdot f,$$

where the correction factor f is dependent on the duty ratio of the pulse voltage signal and on the resistive component of the solenoid (itself dependent on temperature). Since the instantaneous current value Ir is measurable by the circuit disclosed herein, the average current value Iave can be calculated if the correction factor f can be determined.

However, when the solenoid is disposed in a position which is subject to engine temperature variations, as is the case in a preferred embodiment, the resistive component of the solenoid is unstable and thus the correction factor f is difficult to determine. It is therefore preferred to detect an instantaneous current value Ir, for which a correction factor f may be established which is not dependent on the resistive component of the solenoid.

As is well known in the art, when the temperature of the solenoid increases, the resulting change in the resistive component of the solenoid causes the solenoid current shown in FIG. 2a to decrease, as detailed in dotted line a1. Conversely, when the temperature of the solenoid decreases, the resulting change in the resistive component of the solenoid causes the solenoid current shown in FIG. 2a to increase, as detailed in dotted line a2. These two waveforms intersect at a point A in FIG. 2a. Therefore, the instantaneous current value Ir at the point A is an instantaneous current value Ir, for which a correction factor f may be established which is not dependent on the resistive component of the solenoid. Thus, the average current value Iave may be determined based on the instantaneous current value Ir at the point A and the correction factor f.

FIG. 4 is a graph which relates the relation between a correction factor (f) and the duty ratio of the solenoid. A curve C is shown which relates values of the correction factor f to values of the duty ratio. When instantaneous current value Ir is measured at the point A, the correction factor f does not depend on the resistive component of the solenoid. The correction factor f thus will depend only on the duty ratio of the solenoid, and may be calculated by means of a reference which embodies the relation of curve C in FIG. 4, such as a reference table stored in microcomputer 4.

The instantaneous current value Ir can be determined for the point A by adjusting the time constant of the differentiation circuit disclosed herein, specifically by adjusting the timing of the negative differential voltage d1, after it has started to fall to reach the cutoff level of the transistor 14, to correspond to point A. Such a differential signal is shown by a dotted line in FIG. 2d. When the differentiation circuit is so adjusted, the amplified voltage output by the amplifier 13 at the point B1 in FIG. 2b is used to charge the capacitor 18, is measured by the A/D converter 21, and is read by the microcomputer 4. This voltage corresponds to the instantaneous current value Ir; thus it is easy to calculate the average current value Iave.

Thus the instantaneous solenoid current value is detected by use of a solenoid current detection resistor, the detected value is sampled at intervals of a predetermined pulse voltage period, and the average current value is determined by calculation based on the sampled value. Because it is so determined, the average current value is determined much quicker than the known methods of measurement by use of a filter. Thus, with the present invention, correction of the solenoid current by feedback control methods ca be executed without delay.

While a preferred embodiment is disclosed herein, many variations are possible which remain within the scope of the invention, and these variations would become clear to one skilled in the art after a perusal of the specification, drawings and claims herein.

We claim:

1. A current detection apparatus for use in an electromagnetic actuator drive circuit, said electromagnetic actuator drive circuit including
    solenoid drive means subject to switching regulation by the presence of a pulse voltage for passing a pulsating solenoid current through a solenoid of an electromagnetic actuator,
    an electromagnetic valve whose opening is varied according to the solenoid current,
    pulse voltage generation means for generating the pulse voltage having a constant period and a duty ratio variable in accordance with a predetermined opening of the electromagnetic valve and supplying the pulse voltage to said solenoid drive means, and
    solenoid current detection means for detecting the pulsating solenoid current,
    said current detection apparatus for use in an electromagnetic actuator drive circuit comprising:
    means for sampling the output of said solenoid current detection means at a predetermined time point in the period when said solenoid drive means is held in an "on" state by the presence of the pulse voltage;
    calculation means for calculating the average current value of the solenoid current based on the sampling value obtained by said sampling means; and
    feedback means for correcting the pulse voltage according to the average current value.

2. A current detection apparatus for use in an electromagnetic actuator drive circuit according to claim 1, wherein said predetermined time point is in synchrony with the time point of the edge appearing in the pulse voltage.

3. A current detection apparatus for use in an electromagnetic actuator drive circuit according to claims 1 or 2, wherein said predetermined time point is the time point a predetermined length of time behind the time point of the edge appearing in the pulse voltage.

4. A circuit for measuring average current in a solenoid, said circuit comprising
    means for sampling an instantaneous solenoid current at predetermined intervals of a periodic pulse voltage signal to obtain a sample value;
    means for calculating said average current for an entire period of said signal by calculation based on said sample value.

5. A circuit as in claim 4, wherein said predetermined intervals include a time in synchrony with an edge of said pulse voltage signal.

6. A current detection apparatus for use in an electromagnetic actuator drive circuit, said electromagnetic actuator drive circuit including:
    solenoid drive means subject to switching regulation by the presence of a pulse voltage for passing a pulsating solenoid current through a solenoid of an electromagnetic actuator,
    an electromagnetic valve whose opening is varied according to the solenoid current,
    pulse voltage generation means for generating the pulse voltage having a constant period and duty ratio variable in accordance with a predetermined opening of the electromagnetic valve and supplying the pulse voltage to said solenoid drive means, and
    solenoid current detection means for detecting the pulsating solenoid current,
    said current detection apparatus for use in an electromagnetic actuator drive circuit comprising:
    means for sampling the output of said solenoid current detection means at a predetermined time point in the period when said solenoid drive means is held in a "on" state by the presence of the pulse voltage;
    calculation means for calculating the average current value of the solenoid current based on the sampling value obtained by said sampling means; and
    feedback means for correcting the pulse voltage according to the average current value;
    wherein said predetermined time point is the time point a predetermined length of time behind the time point of the edge appearing in the pulse voltage, and
    wherein said time point a predetermined length of time behind is the time point at which the temperature dependent resistive component of said solenoid exhibits the smallest variation.

7. A circuit for measuring average current in a solenoid, said circuit comprising
    means for sampling an instantaneous solenoid current at predetermined intervals of a periodic pulse voltage signal to obtain a sample value; and
    means of calculating said average current for an entire period of said signal by calculation based on said sample value;
    wherein said predetermined intervals include a time at which a temperature dependent resistive component of said solenoid exhibits the smallest variation.

8. A circuit for controlling average current in a solenoid, said circuit comprising
   means for sampling an instantaneous solenoid current at predetermined intervals of a periodic pulse voltage signal so as to obtain a sample value;
   means for calculating a first numeric value of said average current for an entire period of said signal by calculation based on said sample value;
   means for comparing said first numeric value with a second numeric value of a desired average current; and
   means for correcting said pulse voltage according to a result of said comparison.

9. A circuit as in claim 8, wherein said means for calculating comprises
   means for calculating said first numeric value based on said sample value and a correction factor.

10. A circuit as in claim 8, wherein said means for calculating comprises
    an analog to digital converter;
    a microprocessor coupled to said analog to digital converter and operating under control of software;
    said software comprising means for controlling said microprocessor to calculate said first numeric value based on said sample value and a correction factor.

11. A circuit as in claim 10, wherein said microprocessor comprises memory for storing a correction factor.

12. A circuit as in claim 10, wherein said microprocessor comprises memory for storing a plurality of alternative correction factors.

13. A circuit as in claim 10, wherein said microprocessor comprises memory having a reference table which embodies a relation between said correction factor and a duty ratio.

14. A circuit as in claim 10, wherein said microprocessor comprises memory having a reference table which embodies substantially the relation of curve C in FIG. 4.

15. A current detection apparatus for use in an electromagnetic actuator drive circuit, said electromagnetic actuator drive circuit including
    solenoid drive means subject to switching regulation by the presence of a pulse voltage for passing a pulsating solenoid current through a solenoid of an electromagnetic actuator,
    an electromagnetic valve whose opening is varied according to the solenoid current,
    pulse voltage generation means for generating the pulse voltage having a constant period and a duty ratio variable in accordance with a predetermined opening of the electromagnetic valve and supplying the pulse voltage to said solenoid drive means, and
    solenoid current detection means for detecting the pulsating solenoid current,
    said current detection apparatus for use in an electromagnetic actuator drive circuit comprising
    means for sampling the output of said solenoid current detection means at a predetermined time point in the period when said solenoid drive means is held in an "on" state by the presence of the pulse voltage;
    calculation means for calculating a first numeric value of the average current value of the solenoid current based on the sampling value obtained by said sampling means;
    means for comparing said first numeric value with a second numeric value of a desired average current; and
    feedback means of correcting the pulse voltage according to a result of said comparison.

16. A circuit as in claim 15, wherein said calculation means comprises
    means for calculating said first numeric value based on said sampling value and a correction factor.

17. A circuit as in claim 15, wherein said calculation means comprises
    an analog to digital converter;
    a microprocessor coupled to said analog to digital converter and operating under control of software;
    said software comprising means for controlling said microprocessor to calculate said first numeric value based on said sampling value and a correction factor.

18. A circuit as in claim 17, wherein said microprocessor comprises memory for storing a correction factor.

19. A circuit as in claim 17, wherein said microprocessor comprises memory for storing a plurality of alternative correction factors.

20. A circuit as in claim 17, wherein said microprocessor comprises memory having a reference table which embodies a relation between said correction factor and a duty ratio.

21. A circuit as in claim 17, wherein said microprocessor comprises memory having a reference table which embodies substantially and the relation of curve C in FIG. 4.

* * * * *